United States Patent [19]

Beltramini

[11] Patent Number: 4,893,028
[45] Date of Patent: Jan. 9, 1990

[54] ONE OR MORE INPUT ASYNCHRONOUS REGISTER

[75] Inventor: Angelo Beltramini, Novara, Italy

[73] Assignee: Montedison S.p.A., Milan, Italy

[21] Appl. No.: 214,381

[22] Filed: Jul. 1, 1988

[30] Foreign Application Priority Data

Jul. 7, 1987 [IT] Italy .................. 21201 A/87

[51] Int. Cl.⁴ .......................................... H03K 3/037
[52] U.S. Cl. ................................. 307/291; 328/104; 377/73; 377/66
[58] Field of Search ............... 307/291, 289; 328/104, 328/154, 196, 195, 206; 377/70, 73, 66, 72, 111

[56] References Cited

U.S. PATENT DOCUMENTS 4,277,699 7/1981 Brown et al. .................. 377/73
4,607,173 8/1986 Knoedl, Jr. ..................... 307/291
4,695,743 9/1987 Des Brisay, Jr. ............... 307/291

Primary Examiner—John Zazworsky
Attorney, Agent, or Firm—Stevens, Davis, Miller & Mosher

[57] ABSTRACT

A register is disclosed in which an applied data signal D or its complement $\overline{D}$ is used to set or reset an output RS flip-flop under control of an applied load control signal L. The load control signal is applied to a switching circuit which controls application of the data signal D or $\overline{D}$ to the set or reset input of the output flip-flop such that the data signal is only applied for a time period sufficient to cause a change in state of the output flip-flop.

25 Claims, 10 Drawing Sheets

ONE OR MORE INPUT ASYNCHRONOUS REGISTER

BACKGROUND OF THE INVENTION

1. Field of the Invention

The present invention is directed to a register formed by a D type flip-flop with the data of each input line being loaded into a flip-flop memory element by an appropriate load control which is triggered by the edge of an applied load control input signal associated with each input line. The register uses no transmission gates, either in input or in output and one flip-flop memory element, regardless of the number of the input lines. It may have auxiliary Clear and Reset inputs, and in this case the memory element will respectively behave as an ordinary RS flip-flop.

The register is particularly useful in the construction of "self-clocking" or "self-timing" asyncronous digital circuits.

2. Discussion of the Prior Art

A conventional register having one or more input lines $I_n$ coming from n information sources with which suitable load control input instructions $Ld_n$ are associated is illustrated in FIG. 1. The load control input instructions $Ld_n$ cause a selected input vector $I_n$ to be transferred to the register output Q.

Generally, according to the methods known in the art, such a register can be constructed in two ways. In the first, shown in FIG. 2, a plurality of individual registers $Re_n$ are associated with the $I_n$ input vectors, the outputs of which are connected to register output Q through a plurality of transmission gates $tg_n$. In this case the exchange of input data to the output Q occurs downstream of the registers $Re_n$.

In order to ensure an independence of the active level of the latest load control signal $Ld_i$ ($1 \leq i \leq n$) from previous load control signals an arbiter 11 is used which chronologically enables only the transmission gate $tg_i$ associated with the register $Re_i$ in which the last storage took place, in response to a significant switching edge of the related load input load control signal $Ld_i$.

The second way in which the FIG. 1 register is typically implemented is shown in FIG. 3. Here, the access of $I_n$ information sources to a single Re register is controlled by the transmission gates $tg_n$ which are respectively connected to the input vectors $I_n$. The selected information will be stored in register Re by the significant edge of the load input control signal $Ld_i$. In this case the information exchange is located before the register Re and the output of the register Re is taken as the output Q. In this case, as well, the independence of the active level of the last load signal as compared with prior load signals requires the utilization of an arbiter 11 which chronologically enables only the transmission gate associated with the latest storage control input $Ld_i$. The actual storage of the information, now present on the inside bus, will occur in the Re register only when the information is stabilized. To enable this, the load input control signal $Ld_n$ will accordingly delays be applied to register $R_e$ through a time operator T which delays the latest applied control $Ld_i$ for a period sufficient to allow the information $I_n$ to stabilize. The delay will be controlled by a clock, the time of which is determined only and exclusively on the basis of statistical information.

Both of the FIGS. 2 and 3 circuits require a complex arbiter 11 and for FIG. 3 a clock controlled delay to ensure proper timed operation of the FIG. 1 register.

SUMMARY OF THE INVENTION

The present invention is directed to a unique register configured like an edge-triggered "D" type flip-flop which has one or more inputs and in which the significant edge of the last load input control signal arriving at the register is independent of the level of the other applied load control signal. Thus, no internal arbiter or clock controlled delay is required to ensure proper information transfer from input to output.

Accordingly, an object of the present invention is the provision of a register configured like an edge-triggered "D" type flip-flop having one or more inputs, but no arbiter, and in which the significant edge of the last applied load input control signal applied to the register is logically independent of the level of other applied load control signals.

The above and other objects, advantages and features of the invention will be more readily understood from the following detailed description of the invention which is provided in connection with the accompanying drawings.

DETAILED DESCRIPTION OF THE INVENTION

In the register of the invention, the significant edge (switching edge) of the last applied load input control signal arriving at the register is independent of the level of the other load control signals and is used to control the transmission of information from an applied input vector $I_n$ to an output Q. For purposes of the following description, the applied input vector is designated as a data item D for single vector registers, or as data items $D_1, D_2, \ldots D_n$ for multiple input registers, while the register output is designated Q(1). The applied load control signal for a single input vector register is designated L, while for multiple input registers the applied load control signals respectively associated with the data items $D_1, D_2, \ldots D_n$ are designated $L_1, L_2, \ldots L_n$. In addition, the registers described below are controlled by signal edge transitions which, for convenience of discussion, will be positive edge transitions. Thus, a load control signal L (0→1) indicates a positive transition of an applied load control signal. However, it should be appreciated that the invention could also be implemented to respond to negative load control signal transitions, i.e., (L=1→0).

Figure 13:
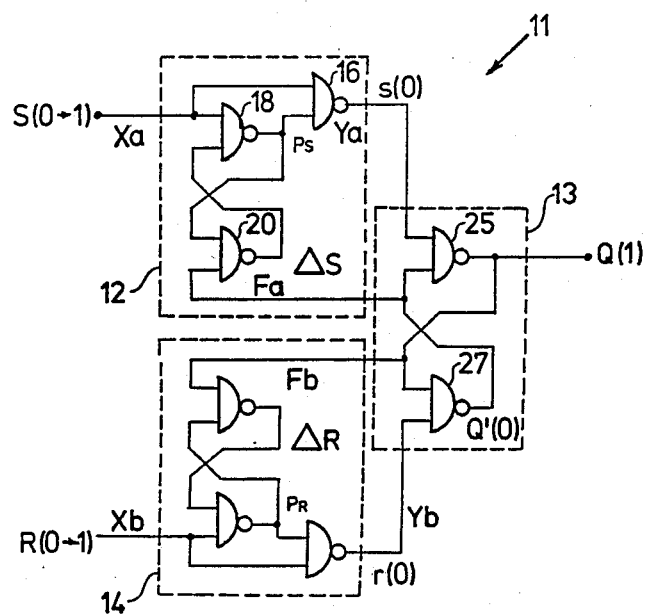
FIG. 13 is an electronic diagram of a flip-flop, known as a FERS flip-flop, which is modified for use in the invention.
Figure 14:
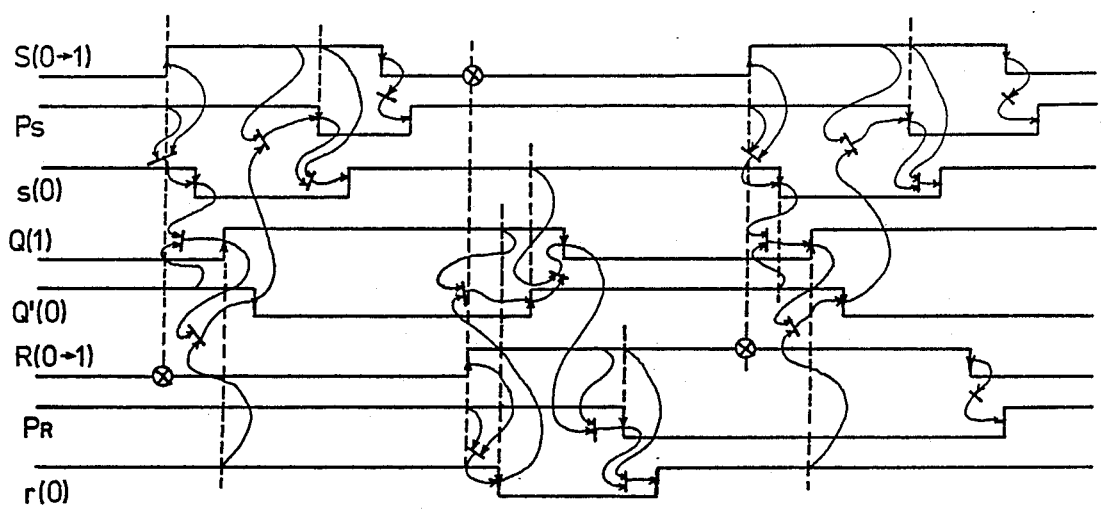
FIG. 14 is a timing diagram illustrating the operation of the FIG. 13 circuit; and, FIG. 15 is an electronic diagram of a modification of the FIG. 10 circuit.

As a general matter, the invention is attained by modifying a flip-flop termed FERS which is described and claimed in U.S. application Ser. No. 191,363, filed May 9, 1988, and entitled "Asynchronous Edge-Triggered RS Flip-Flop Circuit", the disclosure of which is incorporated herein by reference in its entirety. An exemplary FERS flip-flop which can be modified for use in the present invention is illustrated in FIG. 13, while the signal timing diagram therefore is shown in FIG. 14. These drawings respectively correspond to FIGS. 10 and 11 of application Ser. No. 191,363.

As shown in FIG. 13, a flip-flop 11, also called a FERS circuit, includes an ordinary RS flip-flop 13 formed of cross-coupled NAND gates 25 and 27, the output Q(1) of which forms the output of flip-flop 11. Two logical devices 12 and 14 respectively, called ΔS and ΔR DERIVERS, are connected on the ordinary command inputs s(0) and r(0) (now expressed in negative logic) of output flip-flop 13. The function of the ΔS and ΔR DERIVERS is that of sending to the set s(o) and reset r(o) inputs of the output flip-flop 13 the appropriate set or reset signal, in negative logic, only for a time duration that is strictly needed to ensure a change in state of output flip-flop 13, after which the output of the activated DERIVER (either ΔS or ΔR) returns to its rest state. An exemplary construction of ΔS and ΔR DERIVERS using three NAND gates each is shown in FIG. 13, while a detailed description of such DERIVER circuits can be found in U.S. application Ser. No. 165,908, filed March 9, 1988, and entitled "Differentiating Logical Circuit for Asynchronous Systems," the disclosure of which is also incorporated herein by reference in its entirety.

A particular characteristic of a DERIVER circuit is that a derivative output signal Y thereof changes states (e.g., 0→1 for positive logic), upon a change of state (e.g., 0→1) of an applied input signal X, but the output signal Y only reverts to its original state (e.g., 1→0, for positive logic) in response to a transition in a feedback signal F (e.g., 0→1) from a downstream digital circuit. In this way, a DERIVER circuit only supplies an output signal Y for the duration of time it is needed to affect (switch) a downstream digital circuit, as the transition in the feedback signal F, received from the downstream circuit, indicates the occurrence of the switching of the downstream circuit and is used by the DERIVER to return its output to the rest state.

In application Ser. No. 165,908, three types of DERIVER circuits are described. The first type generates the output signal Y in full independence of the state of the feedback signal F, while the second and the third types only generate the output signal Y when the feedback signal F is in a predetermined state, e.g., at rest, but in any event, all three types of DERIVER circuits share the characteristic that the active transition of the feedback signal F is needed to return the output signal Y to a rest state (e.g., 1→0).

FIG. 13 illustrates the above-described signals X, Y and F for DERIVER 12 as Xa, Ya, Fa, and for DERIVER 14 as Xb, Yb and Fb. The timing diagram of FIG. 14 fully explains the operation of the FIG. 13 FERS flip-flop 11, but if additional detail is needed reference may be had to U.S. application Ser. No. 191,363.

In general, the present invention modified the above-described FERS flip-flop as follows. For each input $D_n$ data item, (corresponding to an information input $I_n$) that $D_n$ data item and its complement ($\overline{D}_n$) are respectively applied to: (A) two "OR" gates located inside the FERS flip-flop 11 between the two DERIVERS ΔS and ΔR (12,14) and the RS output flip-flop 13; or B) the respective inputs of two ΔNAND DERIVERS in a FERS flip-flop 11 with the ΔNAND DERIVERS replacing the ΔS and ΔR DERIVERS 12, 14. The corresponding load control signal $Ld_n$ for each data item $D_n$ is applied in common to each of the DERIVERS (whether ΔS and ΔR or ΔNAND) as the DERIVER input X which causes the output Y state of the DERIVER to change.

A more detailed description of the invention now follows.

The register of the invention can be constructed four different ways, with each way having one or more inputs. In a first way, illustrated in FIG. 4, a D data item and its complement $\overline{D}$ data item (complemented by inverter 19) coming from a source are applied to respective inputs of two OR gates 21,23 located inside a FERS flip-flop 30, between two ΔS and ΔR DERIVERS 12, 14 and the RS output flip-flop 13 formed by cross-coupled NAND gates 27,29.

FERS flip-flop circuits can be of the first or second type as fully described in U.S. application Ser. No. 191,363, and a detailed description of the same is omitted herein. Briefly, a first type of FERS flip-flop has ΔR and ΔS DERIVERS which change the output Y state (e.g., 0→1) in response to a significant state change of an applied input X (e.g., 0→1), independent of the state of the feedback signal F, while the second type uses ΔR and ΔS DERIVERS in which the feedback signal must be in a predetermined state to cause a transition (e.g., 0→1) in the DERIVER output Y in response to a transition in the DERIVER input X (e.g., 0→1).

Returning to FIG. 4, only one of the two OR gates 21,23 will pass the edge of an applied load control signal Ld to switch the output flip-flop 13, allowing the setting of a reset flip-flop and the resulting of a set one by the appropriate data item D or $\overline{D}$.

Figure 1:
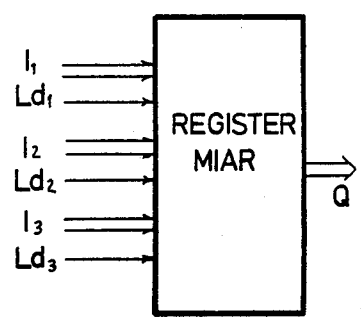
FIG. 1 is a block diagram of a conventional multiple input, single output transfer register.
Figure 2:
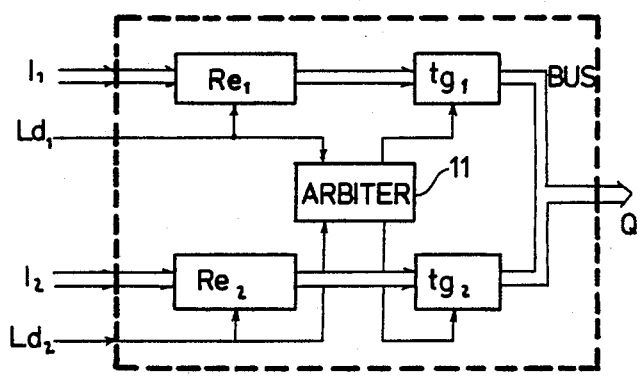
FIG. 2 is a block diagram of the FIG. 1 register realized with "n" input registers and "n" output transmission gates.
Figure 3:
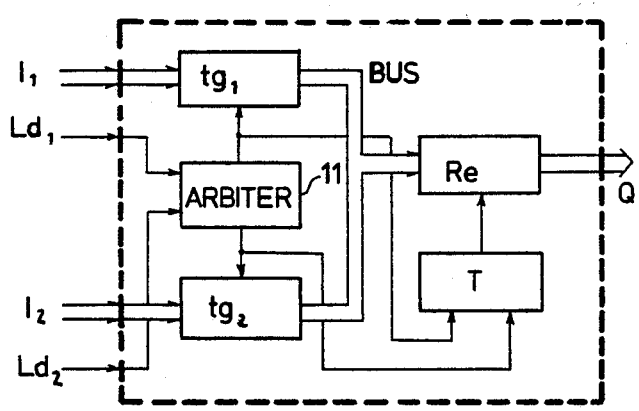
FIG. 3 is a block diagram of a FIG. 1 register realized with "n" input transmission gates and one output register.
Figure 4:
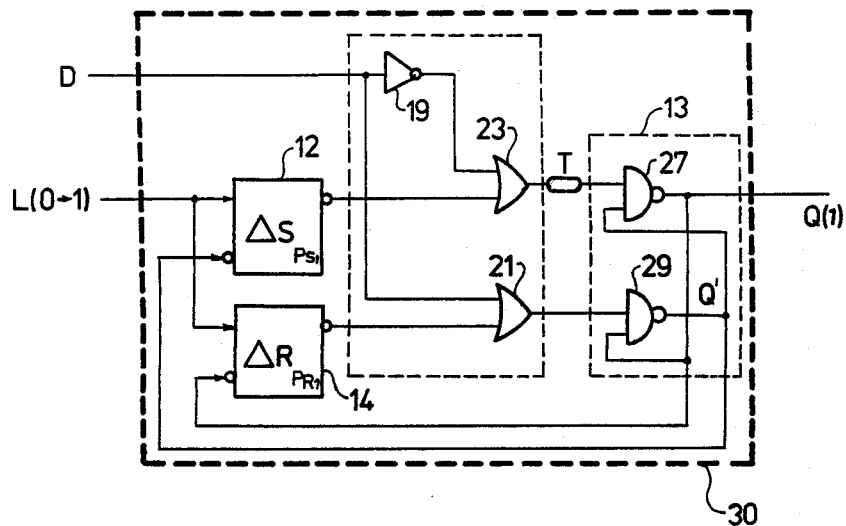
FIG. 4 is an electronic diagram of a first embodiment of the invention employing a first type of edge-triggered "D" type flip-flop, with one data input and one load control input.

The FIG. 4 circuit sends to the output flip-flop 13 the suitable signal D or $\overline{D}$ in negative logic, for a duration that is strictly needed to ensure switching. Of course, switching will occur only if the new data item D or $\overline{D}$ modifies the output state of flip-flop 13. Trying to set an already set flip-flop or to reset a reset one will cause no variation of the interested DERIVER, since it is not active at that moment.

Figure 5:
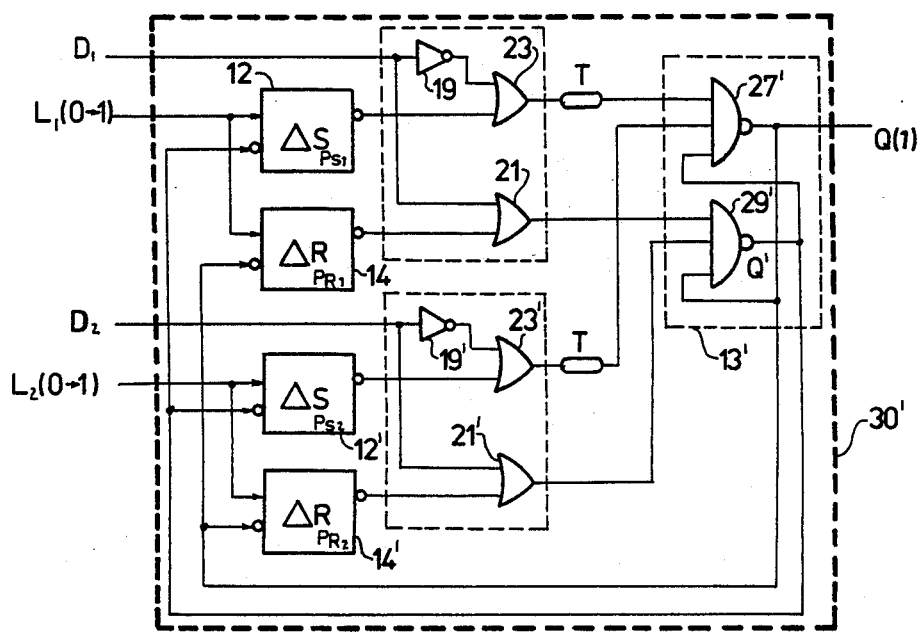
FIG. 5 is an electronic diagram of a second embodiment of the invention, employing the first type of edge-triggered "D" flip-flop with two data inputs and two load control inputs.

FIG. 5 illustrates application of the FIG. 4 circuit to a multiple input register. The logical equations of the output Q(1) of the registers of the invention having respectively one (FIG. 4) and two (FIG. 5) inputs are as follows:

$$Q(1) = (D \wedge L \wedge P_S) \vee Q(\overline{D} \wedge \overline{L} \wedge P_R) \qquad \text{(FIG. 4)}$$

$$Q(1) = (D_1 \wedge L_1 \wedge P_{S1}) \vee (D_2 \wedge L_2 \wedge P_{S2}) \vee Q(\overline{D}_1 \wedge \overline{L}_1 \wedge P_{R1}) \vee (\overline{D}_2 \wedge \overline{L}_2 \wedge P_{R2}) \qquad \text{(FIG. 5)}$$

For n inputs, the equation is as follows:

$$Q(1) = \bigvee_{i=1}^{N} (D_i \, L_i \, P_{Si}) \quad Q \bigwedge_{i=1}^{N} (\overline{D}_i \, \overline{L}_i \, P_{Ri})$$

where "∧" represents the AND function "$\overline{\wedge}$" the $\overline{\text{AND}}$ function, and "V" the OR function, and $P_S$ and $P_R$ represent the states of signals within the derivers (note signals $P_S$ and $P_R$ applied to the output gates of the DERIVERS 12,14 of FIG. 13).

It is noted that the switching time for setting the device may be shorter than for resetting, since the circuit paths are different. The compensation of this time difference, if needed, can be made by interposing a delay element that introduces a unit delay T along the set enabling line of the output flip-flop 13.

The electrical scheme represented in FIG. 4 is therefore that of a new positive edge-triggered "D" flip-flop 30, the load input control of which will become active with the (0→1) switching edge in the applied load control signal L.

As noted, the register circuit of FIG. 4 may be expanded for multiple inputs in the manner illustrated in FIG. 5. In FIG. 5 the register is designated as 30'. It has two data inputs $D_1$, $D_2$ and two load inputs $L_1$(0→1) and $L_2$(0→1). In FIG. 5 the NAND gates 27', 29' forming output flip-flop 13' each have an additional input, over like gates 27,29 in FIG. 4. The additional inputs of NAND gates 27' and 29' respectively receive the additional output signals from a second pair of OR gates 21',23' which together with a second pair of DERIVERS 12' and 14', respectively apply the $D_2$ and $\overline{D}_2$ data items to the additional inputs of output flip-flop 13' under control of load control signal $L_2$.

In the FIG. 4 and 5 circuits the ΔR and ΔS DERIVERS use respective feedback signals taken from the Q(1) and Q(0) outputs of the RS output flip-flop 13'. The present invention can also be implemented by another type of FERS flip-flop described in U.S. application Ser. No. 191,363, which uses only a single feedback signal for the DERIVERS. In this case, which is an alternative to using respective feedback signals, only one feedback signal F, the edge of which (1→0) disables the DERIVER, ΔS or ΔR, is obtained.

Figure 6:
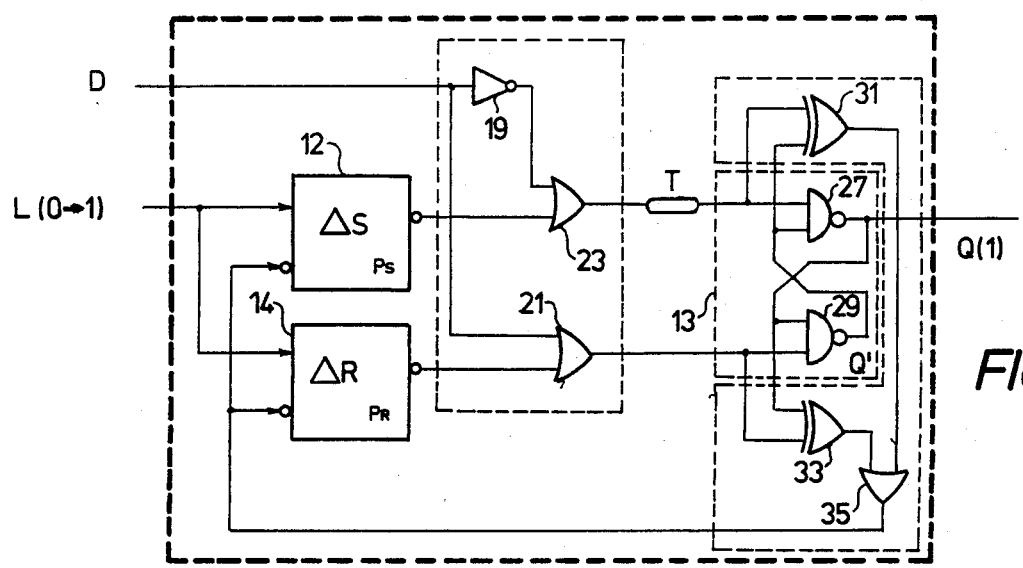
FIG. 6 is an electronic diagram of a third embodiment of the invention employing a second type of edge-triggered "D" type flip-flop with one data input and one load control input.

FIG. 6 corresponds to the FIG. 4 circuit, but using only one feedback signal. Two XOR gates 31,33 and an OR gate 35 are added between the output flip-flop 13 and the feedback inputs of DERIVERS 12,14. The two inputs of XOR gate 31 are respectively connected to the output of NAND gate 29 and the output of OR gate 23, while the two inputs of XOR gate 33 are respectfully connected to the outputs of NAND gate 27 and OR gate 21. The outputs of XOR gates 31 and 33 are connected to respective inputs of OR gate 35, the output of which forms the common feedback signal for the DERIVERS 12,14.

Whenever setting an already set flip-flop or resetting an already reset one, a load action is obtained which results in a static hazard, which though having no consequence, will nevertheless induce the feedback signal capable of disabling the active DERIVER.

The output signal Q(1) equations of devices of the invention using a common feedback, respectively for one input (FIG. 6) and for two inputs (FIG. 7), and with the state of the feedback signal F also being used as a control-condition for switching of the DERIVERS 12,14 are as follows:

$$Q(1) = (D \wedge L \wedge P_S \wedge F) \vee Q(\overline{D} \wedge \overline{L} \wedge P_R \wedge \overline{F})$$

$$Q(1) = (D_1 \wedge L_1 \wedge P_{S1} \wedge F) \vee (D_2 \wedge L \wedge P_{S2} \wedge F) \vee Q(\overline{D}_1 \wedge \overline{L}_1 \wedge P_{R1} \wedge \overline{F}) \wedge (\overline{D}_2 \wedge \overline{L}_2 \wedge P_{R2} \wedge \overline{F});$$

more generally for "n" inputs:

$$Q(1) = \bigvee_{i=1}^{N} (D_i \wedge L_i \wedge P_{Si} \wedge F) \quad Q \bigwedge_{i=1}^{N} (\overline{D}_i \wedge \overline{L}_i \wedge P_{Ri} \wedge \overline{F})$$

The general equation of feedback signal F is:

$$F = Q \bigwedge_{i=1}^{N} (S_i \wedge \overline{R}_i) \overline{\vee} Q \bigwedge_{i=1}^{N} (R_i \wedge \overline{S}_i)$$

where $(S_i = D_i \wedge L_i \wedge P_{Si} \wedge F)$ and $(R_i = \overline{D}_i \wedge \overline{L}_i \wedge P_{Ri} \wedge \overline{F})$.

Figure 7:
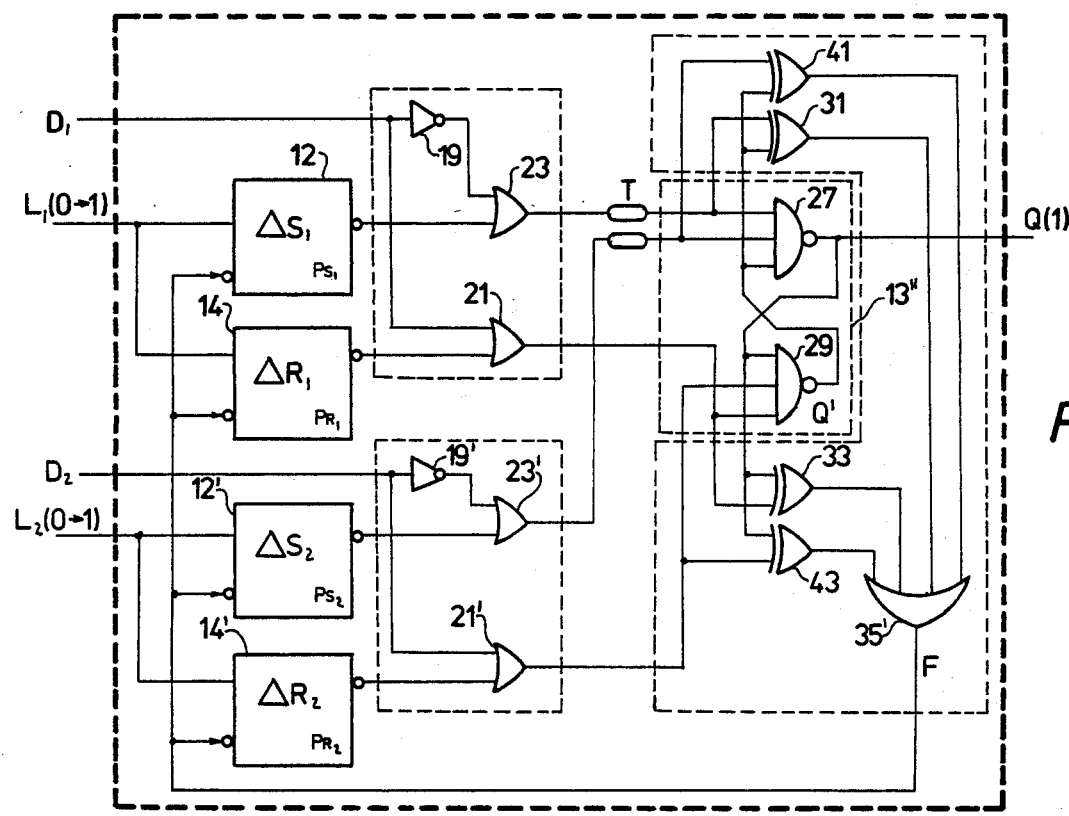
FIG. 7 is an electronic diagram of a fourth embodiment of the invention employing the second type of edge-triggered "D" type flip-flop with two data inputs and two load control inputs.

In the FIG. 7 implementation of the invention, which is a modification of the FIG. 6 embodiment to handle multiple inputs ($D_1, D_2 \ldots; L_1, L_2 \ldots$), additional XOR gates 41 and 43 are provided. XOR gate 41 has one input connected to the Q' output of NAND gate 29 and another connected to the output of OR gate 23', while XOR gate 43 has one input connected to the Q(1) output of NAND gate 27 and another input connected to the output of OR gate 21'. The outputs of XOR gates 31, 33, 41 and 43 are connected to respective inputs of OR gate 35' which provides the common feedback signal F for all DERIVERS at its output.

It is also possible to use ΔNAND DERIVERS in the invention. The ΔNAND DERIVERS replace the ΔS and ΔR DERIVERS. ΔNAND DERIVERS are described in detail in U.S. application Ser. No. 165,908, noted above. Such embodiments of the invention are illustrated in FIGS. 8 through 12. The load control signal L(0→1) edge which enables switching of the device is applied to ΔNAND DERIVERS 58, 60. The selection of the ΔNAND DERIVER which will cause the switching of output flip-flop 13 is made by both the logic level of the data item D and the current state of the output flip-flop 13. The switching of the output flip-flop 13 will be made by an applied load control signal L(0→1), in negative logic, having a duration that is strictly needed to ensure switching.

Figure 8:
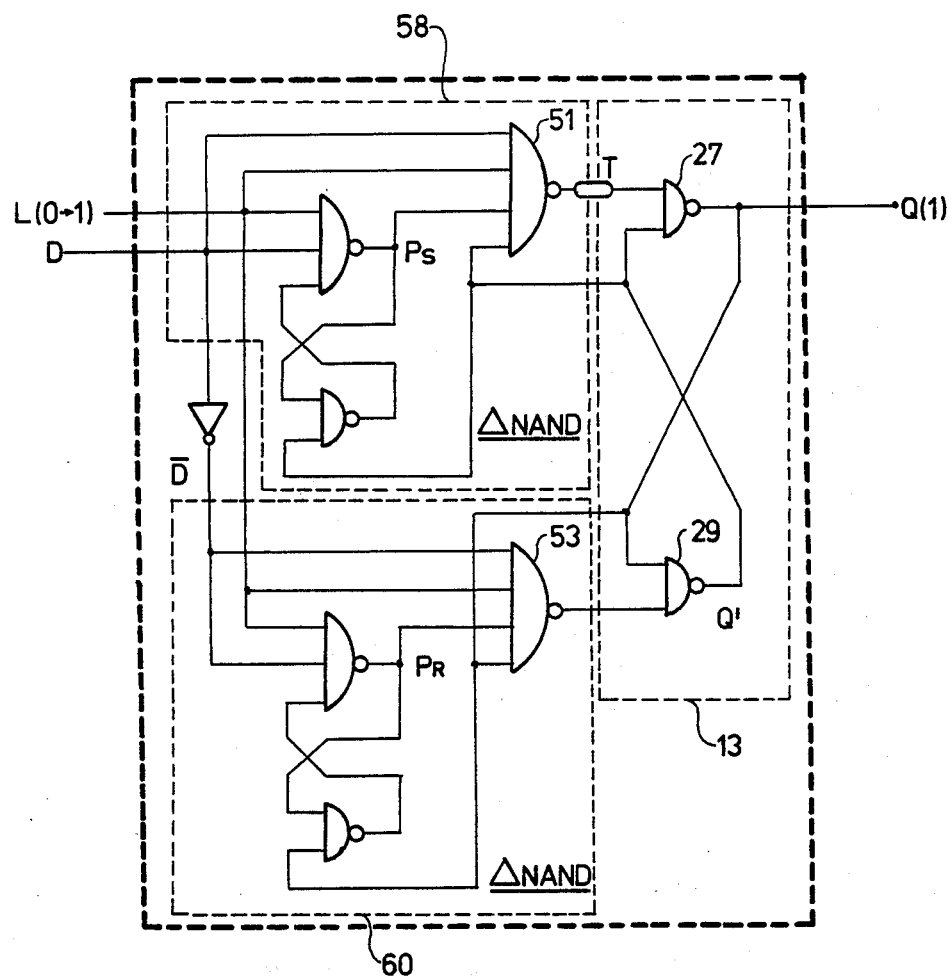
FIG. 8 is an electronic diagram of a fifth embodiment of the invention employing a third type of edge-triggered "D" type flip-flop with one data input and one load control input.

FIG. 8 is an electrical diagram of a "D" register with only one data input item "D" and one load input control signal L(0→1). The equation of the circuit in FIG. 8 is as follows: $Q = (L \wedge D \wedge P_S) \vee (Q \wedge (L \wedge \overline{D} \wedge P_R))$. The equation results from utilizing the equations for a ΔNAND DERIVER and the FERS flip-flop described in the foregoing two U.S. patent applications.

Figure 9:
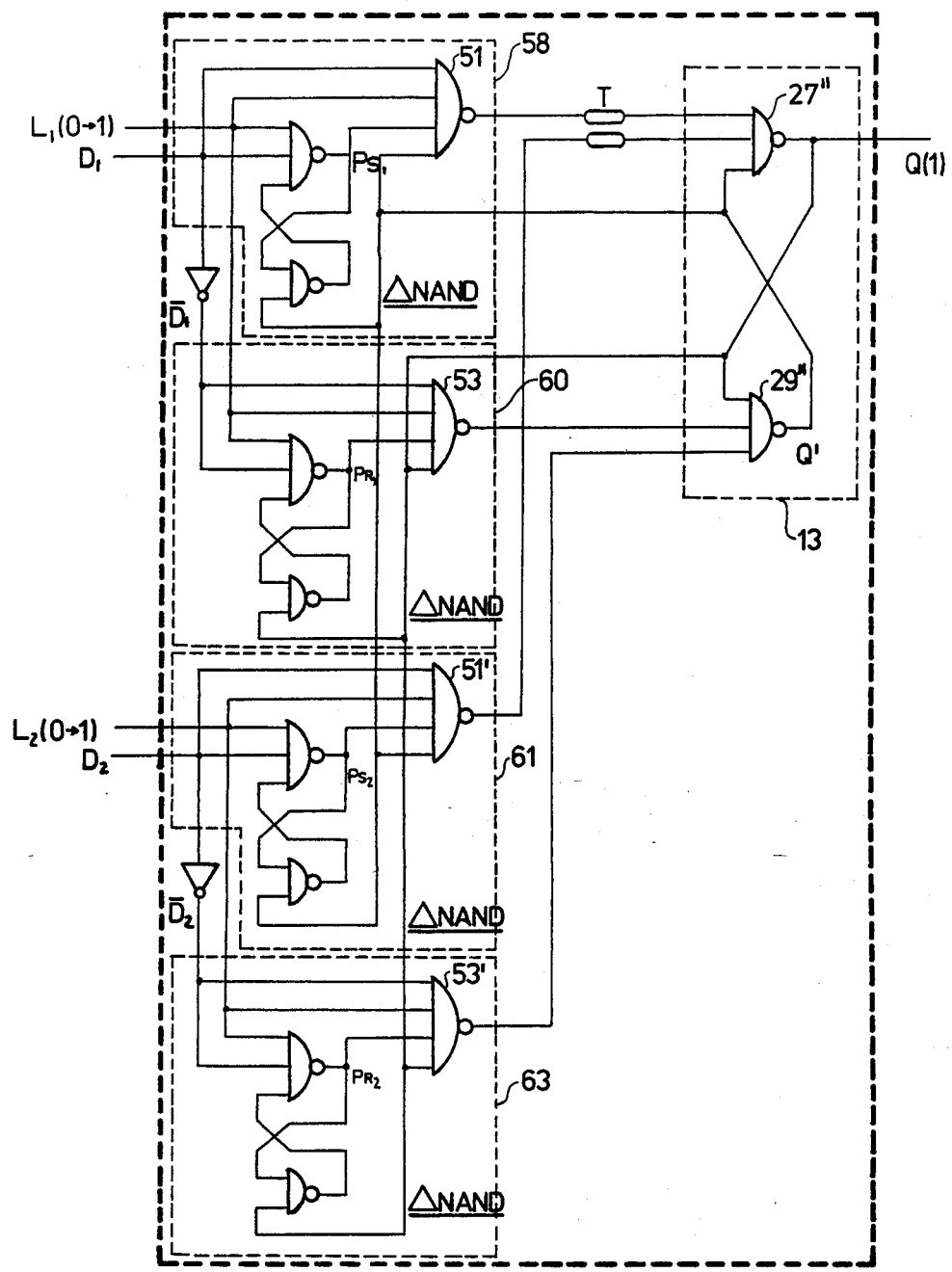
FIG. 9 is an electronic diagram of a sixth embodiment of the invention employing the third type of edge-triggered "D" type flip-flop with two data inputs and two load control inputs.

FIG. 9 is an extension of the FIG. 8 circuit and depicts a register of the invention having two data inputs $D_1$, $D_2$ and two load control signals $L_1(0→1)$, $L_2(0→1)$.

The output signal Q(1) equations, respectively for two and "n" inputs, are as follows:

$$Q(1) = (D_1 \wedge L_1 \wedge P_{S1}) \wedge (D_2 \wedge L_2 \wedge P_{S2}) \vee Q(\overline{D}_1 \wedge L_1 \wedge P_{R1}) \wedge (\overline{D}_2 \wedge L_2 \wedge P_{S2})$$

$$Q(1) = \bigvee_{i=1}^{N} (D_i \; L_i \; P_{Si}) \; Q \bigwedge_{i=1}^{N} (\overline{D}_i \wedge L_i \wedge P_{Ri})$$

For the circuits in FIG. 8 and 9 the outputs Q(1) and Q'(0) of the output flip-flop 13 have been used to generate respective feedback signals for the ΔNAND DERIVERS 58, 60. Also, the output NAND gates 51,53 of the two ΔNAND DERIVERS 58, 60 in FIG. 8 have the data item D and its complement $\overline{D}$ respectively applied to inputs thereof. A similar methodology is used in the multiple input device of FIG. 9, wherein a pair of ΔNAND DERIVERS 61,63 are used for each additional set of inputs $D_N$ and $L_N$. As in the FIG. 5 embodiment, the output from the additional DERIVERS 61,63 is applied to additional respective inputs of the cross-coupled NAND gates 27",29" of output flip-flop 13. In this circuit an additional time delay T is provided between the output of the ΔNAND DERIVER 61 and NAND gate 27".

Figure 10:
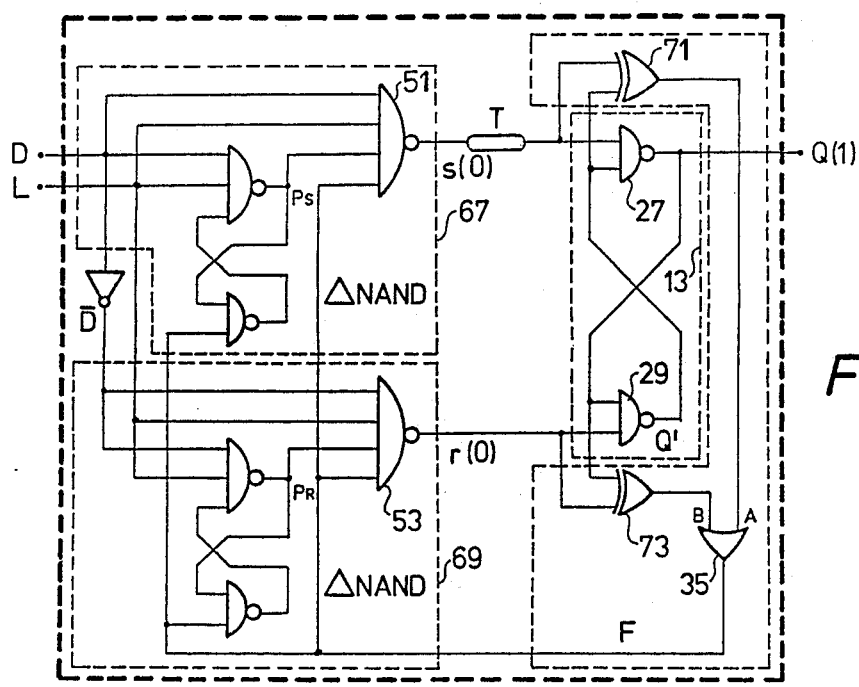
FIG. 10 is an electronic diagram of a seventh embodiment of the invention employing a fourth type of edge-triggered "D" type flip-flop with one data input and one load control input.

FIG. 10 discloses another way to implement the invention using ΔNAND DERIVERS and a single feedback signal.

In this circuit, one feedback signal is used to disable the DERIVER which had caused commutation of the output flip-flop 13. This feedback signal F, the edge of which (1→0) disables the ΔNAND DERIVERS, 67,69 is obtained by the addition of XOR gates 71,73 which have inputs respectively coupled to the inputs of the NAND gates 27,29 of the output flip-flop 13. The XOR gate 71 has one input connected to the output of NAND gate 29 and another input connected to the output of NAND gate 51, while XOR gate 73 has one input connected to the output of NAND gate 27 and another input connected to the output of NAND gate 53. The outputs of XOR gates 71, 73 are connected to respective inputs of OR gate 35, the output of which forms the common feedback signal F for the ΔNAND DERIVERS 67,69.

Whenever setting an already set flip-flop or resetting an already reset one, a load action is obtained, with no consequence, which will nevertheless induce the feedback signal capable of disabling the active ΔNAND DERIVER.

The equation of the circuit in FIG. 10 with one data input D and one control input L(0→1) and with the switching of the DERIVERS controlled by the state of the feedback signal F is as follows:

$$Q = (D \wedge L \wedge P_S \wedge F) \vee (Q \wedge (\overline{D} \wedge L \wedge P_R \wedge F)).$$

Figure 11A:
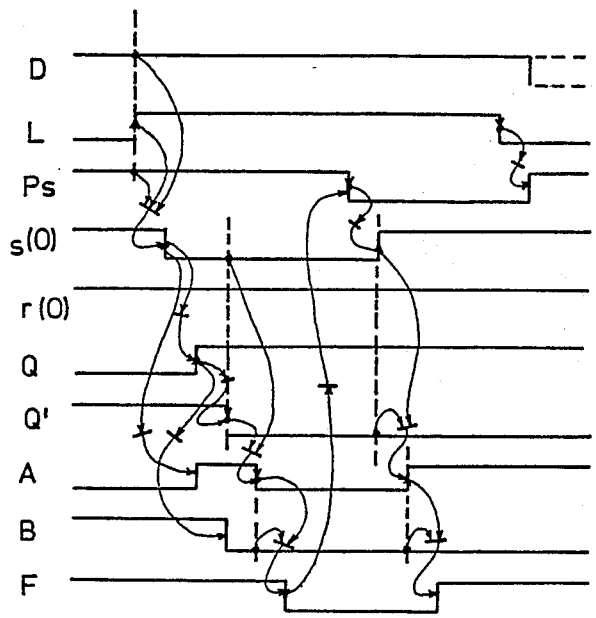
FIGS. 11(A) and 11(B) are timing diagrams illustrating the operation of the FIG. 10 embodiment.
Figure 11B:
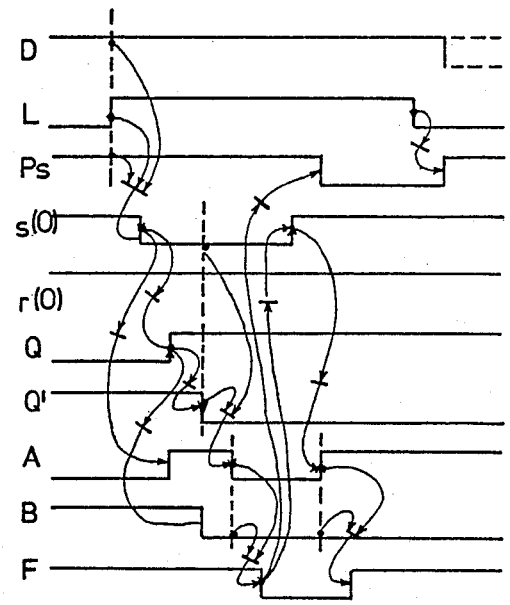

FIGS. 11(a) and 11(b) represent the time diagram of the device of FIG. 10 and show respectively the absence and the presence of a direct feedback connection to the input of the final NAND gates 51,53 of the ΔNAND DERIVERS 67,69. FIG. 10 shows the situation where the direct feedback connection to the final NAND gates 51, 53 is present. It can be seen, by comparing the diagrams in FIGS. 11(a) and 11(b), that the delay in obtaining the commutation F(0→1), coinciding with the steady state, is reduced when connecting the feedback signal F to the final NAND gates 51,53 of the ΔNAND DERIVERS 67,69. In this arrangement the state change of s(0→1) or of r(0→1) is no longer effected through $P_S$ and $P_R$, but occurs straight from F.

Figure 12:
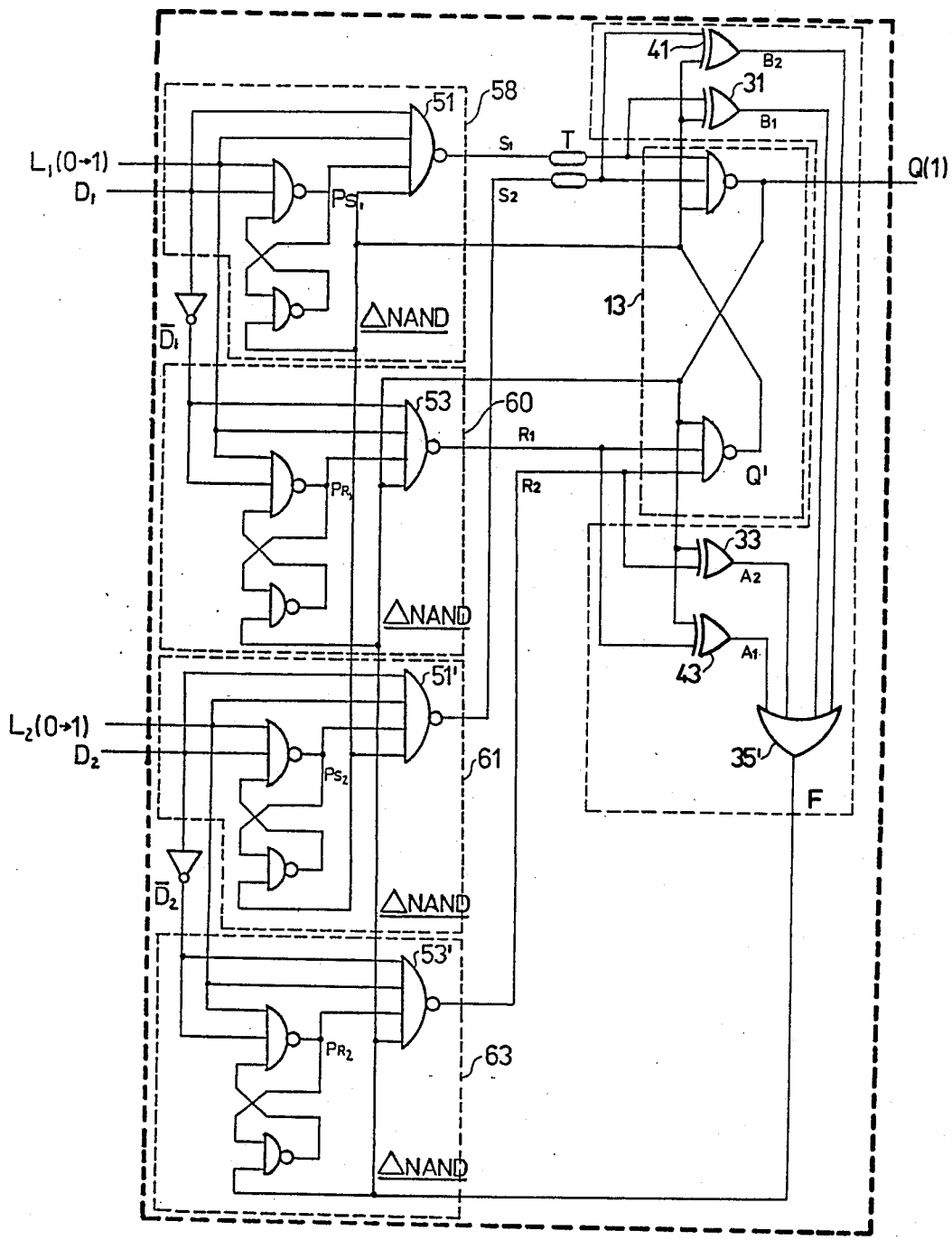
FIG. 12 is an electronic diagram of an eighth embodiment of the invention employing the fourth type of edge-triggered "D" type flip-flop with two data inputs and two load control inputs.

FIG. 12 represents the circuit FIG. 10 circuit extend to have two data inputs $D_1$, $D_2$ and two control inputs $L_1(0→1)$ and $L_2(0→1)$. The output signal Q(1) equations of the FIG. 12 device respectively for two and "n" inputs are as follows:

$$Q(1) = (D_1 \wedge L_1 \wedge P_{S1} \wedge F) \vee (D_2 \wedge L_2 \wedge P_{S2} \wedge F) \vee Q(\overline{D}_1 \wedge L_1 \wedge P_{R1} \wedge F) \wedge (\overline{D}_2 \wedge L_2 \wedge P_{R2} \wedge F);$$

$$Q(1) = \bigvee_{i=1}^{N}(D_i \wedge L_i \wedge P_{Si} \wedge F) \vee Q \bigwedge_{i=1}^{N} (\overline{D}_i \wedge L_i \wedge P_{Ri} \wedge F)$$

With these circuits, as well, the appropriate signal in negative logic is sent to the output flip-flop 13 for a time duration strictly necessary to ensure its commutation. As in the FIG. 7 circuit, XOR gates 31, 41, 33 and 43 and OR gate 35' are used to develop a common feedback signal F. The general equation of this feedback signal is:

$$F = Q \bigwedge_{i=1}^{N} (S_i \; R_i) \; Q \bigwedge_{i=1}^{N} (R_i \; S_i)$$

where $(S_i = D_i \wedge L_i \wedge P_{Si} \wedge F)$ and $(R_i = \overline{D} \wedge L_i \wedge P_{Ri} \wedge F)$.

In FIGS. 4 to 12 a unit delay "T" is represented which may be needed to offset the shorter time used by the register for setting as compared with resetting; when unnecessary, no such delay is required.

Although the invention has been described above as commutating with positive (0→1) transitions of the applied load control signal L, the register of the invention can also be built to respond to negative (1→0) edges of the load control signal for each of the described embodiments. This is applicable to outputs as well, which have been represented in positive logic. It is also possible to utilize DERIVERS using different logics in the same flip-flop.

Figure 15:
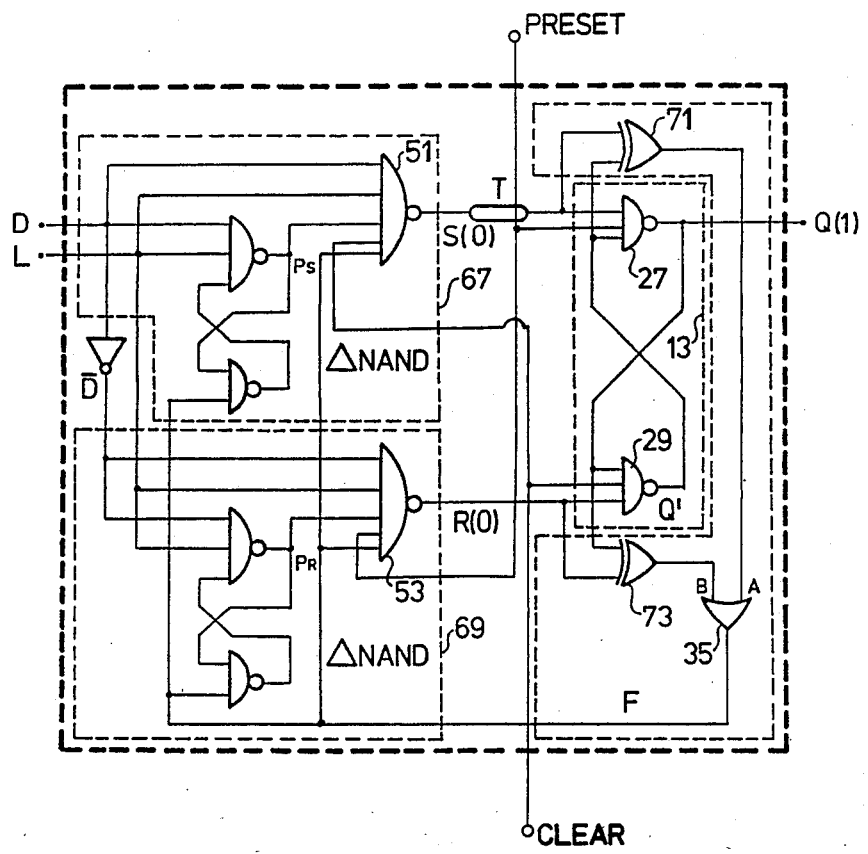

The register of the invention may also have auxiliary clear and preset inputs and with these auxiliary inputs the circuit will behave as an ordinary RS flip-flop. In such a case, as shown by FIG. 15 which illustrates the circuit of FIG. 10 with clear and preset inputs. A preset input is applied to one additional input of cross-coupled NAND gate 27 of the output flip-flop and to the final gate of the ΔNAND DERIVER controlling the other cross-coupled NAND gate 29, while a Clear input is applied to an additional input of the cross-coupled NAND gate 29 and to the final gate of the ΔNAND DERIVER 67 controlling the NAND gate 27.

A register constructed in the form of an edge-triggered "D" type flip-flop circuit has been described hereinabove as exemplary of the invention. However, it should be apparent that many modifications can be made to the invention without departing from the spirit and scope thereof. Accordingly, the invention is not limited by the foregoing description, but is only limited by the scope of the appended claims.

I claim:
1. A register comprising:
an output flip-flop having set and reset inputs and at least one output signal line;
a first gating means for applying an input signal D and its complement $\overline{D}$ respectively to said reset and set inputs under control of a switching edge of an applied input load control signal L, said first gating means operating such that said input signal D and its complement $\overline{D}$ are applied to said reset and set inputs, upon occurrence of a predetermined switching edge of said load control signal only for a period of time sufficient to cause a switching of the state of the output state of said flip-flop by one of said D and $\overline{D}$ signals, said period ending when at least one feedback signal, responsive to said state switching, indicates by a predetermined switching edge that said state switching has occurred.
2. A register as in claim 1 wherein said first gating means comprises:
a first pair of OR gates respectively receiving said D and $\overline{D}$ signals as inputs thereto, the output of one said OR gate being connected to said reset input and the output os the other of said OR gates being connected to said set input; and
a first pair of switching circuits, each having an output Y which changes state upon a change of state of an applied input signal at a signal input X, with said output Y reverting to its original state in response to a predetermined switching edge in a said feed back signal applied at another input, said pair of switching circuits having said load control signal applied in common to the X signal inputs thereof and respective outputs which are connected to respective inputs of said pair of OR gates.
3. A register as in claim 1 wherein said first gating means further comprises:

a plurality of n, where n is an integer, pairs of OR gates, each pair of OR gates respectively receiving $D_n$ and complemented $\overline{D}_n$ signals as inputs thereto, the output of one of the OR gates of each pair being connected to a respective reset input of said output flip-flop and the output of the other of said OR gates of each pair being connected to a respective set input of said output flip-flop,
a plurality of n pairs of switching circuits, each having an output Y which changes state upon a change of state of an applied input signal at a signal input X, with said output Y reverting to its original state in response to a predetermined switching edge in a said feedback signal applied at another input, each pair of said switching circuits having one of a plurality of load control signals $L_n$ applied in common to the X signal inputs thereof and respective outputs connected to respective inputs of an associated pair of OR gates receiving the $D_n$ and $\overline{D}_n$ signals.
4. A register as in claim 3 wherein an output signal Q(1) of said output flip-flop is defined by the logical equation:

$$Q(1) = \bigvee_{i=1}^{N} (D_i \wedge L_i \wedge P_{Si}) \; Q \; \bigwedge_{i=1}^{N} (\overline{D}_i \overline{\wedge} L_i \overline{\wedge} P_{Ri})$$

where Q is the complemented output of the output Q(1) of said output flip-flop, $D_i$ and $\overline{D}_i$ are the respective D and $\overline{D}$ inputs for each of said pairs of OR gates, $L_i$ is the respective common load control signal for each pair of switching circuits, $P_{Si}$ and $P_{Ri}$ are respective internal signal states of switching circuits respectively controlling application of the $D_i$ and $\overline{D}_i$ signals to set and reset inputs of said output flip-flop, ∧ represents a logical AND function, V represents a logical OR function and $\overline{\wedge}$ represents a logical $\overline{AND}$ function.
5. A register as in claim 2 wherein each of said switching circuits has a respective feedback signal applied thereto, one of said feedback signals being taken from said output signal line, and the other being a complement of the signal on said output signal line.
6. A register as in claim 2 wherein a single feedback signal is applied in common to said pair of switching circuits.
7. A register as in claim 6 wherein said output flip-flop is formed by a pair of cross-coupled logical gates, said register further comprising a second gating means for generating said common feedback signal, said second gating means comprising a first XOR gate having one input connected to an output of a first of said cross-coupled logical gates and another input connected to an output of one of said OR gates, a second XOR gate having one input connected to an output of a second of said cross-coupled logical gates and another input connected to an output of the other of said OR gates, and another OR gate receiving the outputs of said first and second XOR gates and providing said common feedback signal at its output.
8. A register as in claim 3 wherein first and second feedback signals are produced at said output flip-flop, one of said feedback signals being taken from said output signal line, and the other being a complement of the signal on said output signal line, one of the switching circuits of each pair of switching circuits receiving said first feedback signal and the other of the switching circuits of each pair of switching circuits receiving said second feedback signal.

9. A register as in claim 3 wherein a single feedback signal is produced which is applied in common to all of said switching circuits.

10. A register as in claim 9 wherein said output flip-flop is formed by a pair of cross-coupled logical gates, said register further comprising a second gating means for producing said common feedback signal, said second gating means comprising a first plurality of XOR gates, each having one input connected to an output of one of said cross-coupled logical gates and another input respectively connected to an output of a first OR gate of a respective pair of OR gates, a second plurality of XOR gates each having one input connected to an output of the other of said cross-coupled logical gates and another input respectively connected to an output of second OR gate of a respective pair of OR gates, the outputs of said XOR gates being applied to another OR gate which produces said common feedback signal.

11. A register as in claim 1, wherein said first gating means comprises:
a first switching circuit including a first output gate, an output signal of said first output gate being connected to one of said set and reset inputs of said output flip-flop, said first switching circuit having at least three inputs, a first for receiving a data D input signal, a second for receiving a load control signal L, and a third for receiving a feedback signal which changes state upon a change in state of said output flip-flop; and,
a second switching circuit including a second output gate, an output signal of said second output gate being connected to the other of said set and reset inputs of said output flip-flop, said second switching circuit having at least three inputs, a first for receiving an inverted data $\overline{D}$ input signal, a second for receiving said load control signal L and a third for receiving a feedback signal which changes state upon a change in state of said output flip-flop,
said first and second switching circuits operating such that one of said data signals D and $\overline{D}$ is applied to a respective reset and set input of said output flip-flop through said first or second output gates upon the occurrence of said predetermined switching edge of said load control signal only for said period of time, said period of time ending when that switching circuit applying the D or $\overline{D}$ signal to said output flip-flop detects said predetermined switching edge in an associated feedback signal indicating a change of state of said output flip-flop.

12. A register as in claim 11 wherein each of said first and second output gates is a NAND gate.

13. A register in claim 12 wherein each said output NAND gate has a first input for receiving one of said data signals D and $\overline{D}$, a second input for receiving an applied load signal L, and a third input for receiving the output of an associated control flip-flop, said control flip-flop for said first switching circuit respectively receiving at first and second inputs thereto said applied data signal D and load control signal L, and at a third input a said feedback signal, said control flip-flop for said second switching circuit receiving at first and second inputs thereto said applied data signal $\overline{D}$ and load control signal L, and at a third input a said feedback signal.

14. An register as in claim 13 wherein said first output NAND gate has an input for receiving the feedback signal applied to the control flip-flop for said first switch circuit and said second output NAND gate has an input for receiving the feedback signal applied to the control flip-flop for said second switching circuit.

15. A register as in claim 13 wherein a single feedback signal is applied in common to said first and second output NAND gates.

16. A register as in claim 15 wherein said output flip-flop is formed by a pair of cross-coupled logical gates, said register further comprising a second gating means for generating said common feedback signal, said second gating means comprising a first XOR gate having one input respectively connected to an output of a first of said cross-coupled logical gates and a second input connected to an output of one of said NAND gates, a second XOR gate having one input connected to an output of a second of said cross-coupled logical gates and another input connected to the output of the other of said output NAND gates, and an OR gate receiving the outputs of said first and second XOR gates and providing said common feedback signal at its output.

17. A register as in claim 11 wherein said first gating means further comprises:
a plurality of pairs of said first and second switching circuits, each of said pairs of first and second switching circuits respectively receiving one of a plurality of applied data signal $D_N$ and an associated one of a plurality of applied load control signal $L_N$ and applying one of its data $D_N$ or complement $\overline{D}_N$ signal to an associated reset or set input of said output flip-flop in response to a switching edge of its associated load control signal $L_N$, only for said period of time which ends when the switching circuit applying the $D_N$ or $\overline{D}_N$ signal to said output flip-flop detects a switching edge in an associated feedback signal indicating a change of state of said output flip-flop.

18. A register as in claim 13 further comprising:
a plurality of pairs of said first and second switching circuits, each pair having respective first and second switching circuits, each pair having respective first and second output NAND gates, each of said pairs of first and second switching circuits respectively receiving one of a plurality of applied data signals $D_N$ and an associated one of a plurality of applied load control signal $L_N$ and applying one of its data $D_N$ or complement $\overline{D}_N$ signal to an associated reset or set input of said output flip-flop in response to a switching edge of its associated load control signal $L_N$, only for said period of time which ends when the switching circuit applying the $D_N$ or $\overline{D}_N$ signal to said output flip-flop detects a switching edge in an associated feedback signal indicating a change of state of said output flip-flop.

19. A register as in claim 18 wherein the feedback signal for one of the switching circuits of each pair of switching circuits is taken from a first output of said output flip-flop while the feedback signal for the output of the other of the switching circuits of each pair of switching circuits is taken from a complement of the first output of said output flip-flop.

20. A register as in claim 18 wherein a single feedback signal is applied in common to all of said switching circuits.

21. A register as in claim 20 wherein said output flip-flop is formed by a pair of cross-coupled logical gates and further comprising a second gating means for producing said common feedback signal, said second gating means comprising a first plurality of XOR gates, each having one input connected to an output of one of said cross-coupled logical gates and another input respectively connected to an output of a first output NAND gate of a respective pair of said switching circuits, a second plurality of XOR gates each having one input connected to an output of the other of said cross-coupled logical gates and another input respectively connected to an output of a second output NAND gate of a respective pair of switching circuits, the outputs of said XOR gates being applied to an OR gate which produces said common feedback signal.

22. A register as in claim 4 wherein each of said switching circuits changes state upon a change of state of an applied input signal X only when said feedback signal F is in a predetermined state and said output signal Q(1) is defined by the logical equation:

$$Q(1) = \bigvee_{i=1}^{N}(D_i \wedge L_i \wedge P_{Si} \wedge F) \vee Q \bigwedge_{i=1}^{N}(\overline{D}_i \overline{\wedge} L_i \overline{\wedge} P_{Ri} \overline{\wedge} F)$$

and the feedback signal logical equation is:

$$F = \overline{Q} \bigwedge_{i=1}^{N}(S_i \wedge \overline{R}_i) \overline{\vee} Q \bigwedge_{i=1}^{N}(R_i \wedge \overline{S}_i)$$

where $S_i = D_i \overline{\wedge} L_i \overline{\wedge} P_{Si} \overline{\wedge} F$ and $R_i = \overline{D}_i \overline{\wedge} L_i \overline{\wedge} P_{Ri} \overline{\wedge} F$, where $\overline{Q}$ is the complement of output signal Q(1) of said output flip-flop, $D_i$ and $\overline{D}_i$ are the respective D and $\overline{D}$ inputs for each of said pairs of OR gates, $L_i$ is the respective common load control signal for each pair of switching circuits, and $P_{Si}$ and $P_{Ri}$ are respective internal signal states of switching circuits respectively controlling application of the $D_i$ and $\overline{D}_i$ signals to the set and reset inputs of said output flip-flop.

23. A register as in claim 18 wherein the output signal Q(1) of said output flip-flop is defined by the logical equation:

$$Q(1) = \bigvee_{i=1}^{N}(D_i \wedge L_i \wedge P_{Si} \vee Q \bigwedge_{i=1}^{N}(\overline{D}_i \overline{\wedge} L_i \overline{\wedge} P_{Ri})$$

where Q is the output of said output flip-flop, $D_i$ and $\overline{D}_i$ are the respective D and $\overline{D}$ inputs for the first and second output NAND gates of each pair of switching circuits, $L_i$ is the respective common load control signal for each pair of switching circuits, and $P_{Si}$ and $P_{Ri}$ are respective internal signal states of switching circuits respectively controlling application of $D_i$ and $\overline{D}_i$ signals to the set and reset inputs of said output flip-flop.

24. A register as in claim 23 wherein each of said switching circuits changes state upon occurrence of said predetermined switching edge of an applied load signal only when said feedback signal F is in a predetermined state and said output signal Q(1) is defined by the logical equation:

$$Q(1) = \bigvee_{i=1}^{N}(D_i \wedge L_i \wedge P_{Si} \wedge F) \quad Q \bigwedge_{i=1}^{N}(\overline{D}_i \overline{\wedge} L_i \overline{\wedge} P_{Ri} \overline{\wedge} F)$$

and the feedback signal logical equation is:

$$F = \overline{Q} \bigwedge_{i=1}^{N}(S_i \wedge R_i) \vee Q \bigwedge_{i=1}^{N}(R_i \wedge S_i)$$

where $S_i = D_i \overline{\wedge} L_i \overline{\wedge} P_{Si} \overline{\wedge} F$ and $R_i = \overline{D}_i \overline{\wedge} L_i \overline{\wedge} P_{Ri} \overline{\wedge} F$, where $\overline{Q}$ is the complement of output signal Q(1) of said output flip-flop, $D_i$ and $\overline{D}_i$ are the respective D and $\overline{D}$ inputs for each of said pairs of output NAND gates, $L_i$ is the respective common load control signal for each pair of switching circuits, and $P_{Si}$ and $P_{Ri}$ are respective internal signal states of switching circuits respectively controlling application of the $D_i$ and $\overline{D}_i$ signals to the set and reset inputs of said output flip-flop.

25. A register as in claim 1 further comprising means for placing said output flip-flop in one of a CLEAR state and a PRESET state.

* * * * *